(12) United States Patent
Monzel

(10) Patent No.: US 6,879,524 B2
(45) Date of Patent: Apr. 12, 2005

(54) MEMORY I/O BUFFER USING SHARED READ/WRITE CIRCUITRY

(75) Inventor: Carl A. Monzel, Lakeville, MN (US)

(73) Assignee: LSI Logic Corporation, Milpitas, CA (US)

( * ) Notice: Subject to any disclaimer, the term of this patent is extended or adjusted under 35 U.S.C. 154(b) by 189 days.

(21) Appl. No.: 10/247,594

(22) Filed: Sep. 19, 2002

(65) Prior Publication Data
US 2004/0057290 A1 Mar. 25, 2004

(51) Int. Cl.[7] .................................................. G11C 7/00
(52) U.S. Cl. .............. 365/189.05; 365/196; 365/189.01
(58) Field of Search ....................... 365/189.05, 189.02, 365/190, 196, 202, 189.01

(56) References Cited

U.S. PATENT DOCUMENTS

| 5,132,928 A | * | 7/1992 | Hayashikoshi et al. | 365/185.13 |
| 5,500,820 A | * | 3/1996 | Nakaoka ................. | 365/189.01 |
| 5,661,729 A | * | 8/1997 | Miyazaki et al. ........... | 714/719 |

* cited by examiner

Primary Examiner—Thong Q. Le
(74) Attorney, Agent, or Firm—Westman, Champlin & Kelly, P.A.

(57) ABSTRACT

A memory input-output (IO) buffer is provided, which includes a bit line, a data input-output line and a combined sense amplifier and write driver. The combined sense amplifier and write driver is coupled to the data input-output line and the first bit line and shares the same physical area on an integrated circuit.

14 Claims, 2 Drawing Sheets

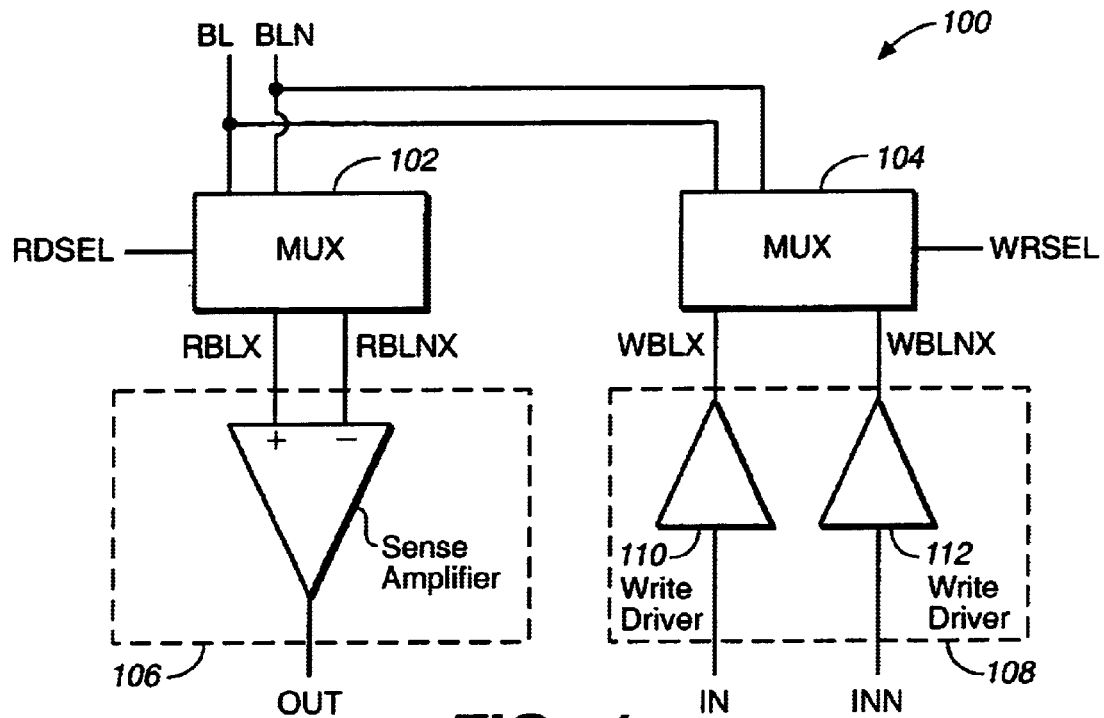
FIG._1
*(PRIOR ART)*
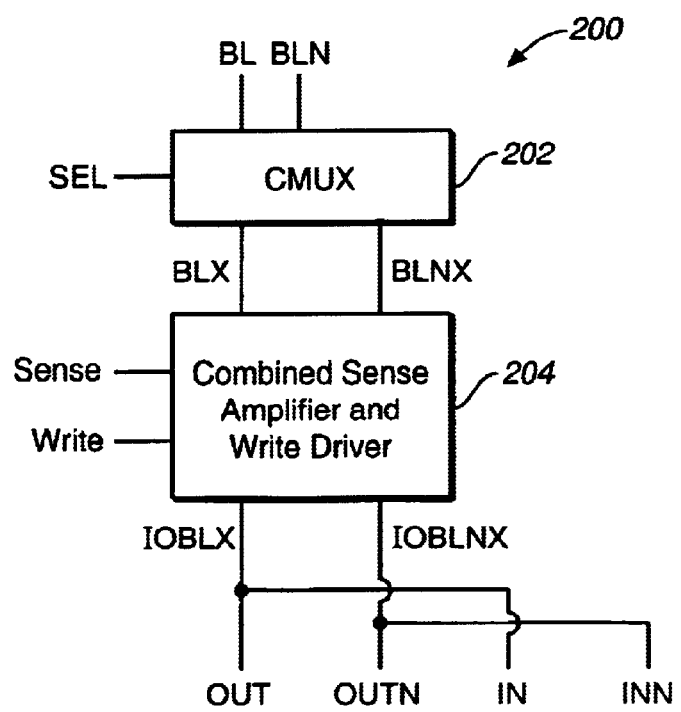
FIG._2

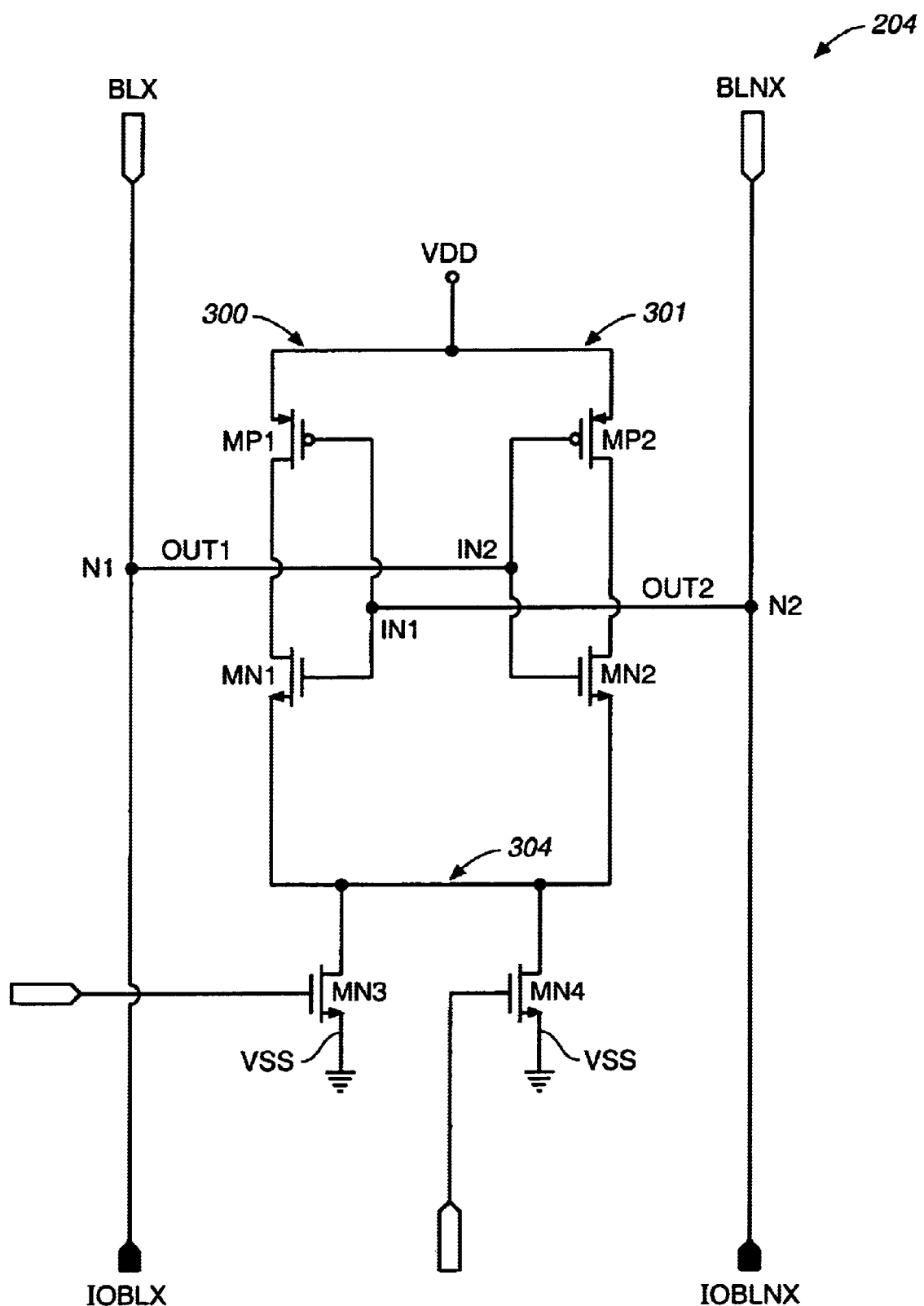
FIG._3

US 6,879,524 B2

MEMORY I/O BUFFER USING SHARED READ/WRITE CIRCUITRY

BACKGROUND OF THE INVENTION

The present invention relates to semiconductor integrated circuit memories and, in particular, to input-output (I/O) buffers for controlling read and write operations.

Semiconductor integrated circuit memories include a plurality of memory elements or cells, which are arranged in rows and columns. The memory cells in each column are coupled to a respective pair of complementary bit lines. Each pair of bit lines has a differential voltage representing the data being read from or written to a memory cell in that column.

A typical memory I/O buffer includes a column multiplexer, a sense amplifier and a write driver. The column multiplexer multiplexes groups of bit lines into respective data input-output lines. There is a sense amplifier and a separate write driver for each pair of multiplexed data input-output lines. The write drivers and sense amplifiers are separate circuits that occupy separate physical areas on the integrated circuit in which the memory is fabricated. The separate circuits also require individual column multiplex select logic and control lines, one set for read accesses and one set for write accesses.

During a read access, the read column select logic for the selected column is enabled, and then the corresponding sense amplifier is enabled to sense the data provided by the enabled column. The write drivers are idle during a read access. During a write access, the write column select logic is enabled, and the write drivers amplify the input data onto the bit lines of the selected column. The sense amplifiers can be used or bypassed to sense the data being written through the write drivers.

The use of separate write drivers and sense amplifiers requires two large blocks of circuitry, which consumes a relatively large amount of physical area on the integrated circuit. This increases the cost of semiconductor memory dies and potentially limits the number of memory cells that can be fabricated on the die. Improved memory I/O buffers are therefore desired that use less area than a convention I/O buffer.

SUMMARY OF THE INVENTION

One embodiment of the present invention is directed to a memory input-output (IO) buffer, which includes a bit line, a data input-output line and a combined sense amplifier and write driver. The combined sense amplifier and write driver is coupled to the data input-output line and the first bit line.

Another embodiment of the present invention is directed to a combined sense amplifier and write driver circuit. The circuit includes first and second complementary bit lines, first and second complementary data input-output lines, and a selectively enabled latching amplifier, which is coupled to the first and second complementary bit lines and the first and second complementary data input-output lines. The latching amplifier is enabled during a read state and a write state and is disabled during an idle state.

Yet another embodiment of the present invention is directed to a memory input-output (IO) buffer, which includes first and second complementary bit lines, first and second complementary data input-output lines, a column multiplexer element, and a combined read sense and write driver. The column multiplexer element is coupled to the complementary bit lines, and the combined read sense and write driver is coupled between the column multiplexer element and the complementary data input-output lines. The combined read sense and write driver senses voltages on the complementary bit lines through the column multiplexer element during a read state and drives voltages on the complementary bit lines through the column multiplexer element during a write state.

BRIEF DESCRIPTION OF THE DRAWINGS

FIG. 1 is a diagram of a memory I/O buffer according to the prior art.

FIG. 2 is a diagram of a memory I/O buffer according to one embodiment of the present invention.

FIG. 3 is a diagram of a non-isolated latching sense amplifier and write driver circuit within the I/O buffer shown in FIG. 2 according to one embodiment of the present invention.

DETAILED DESCRIPTION OF THE PREFERRED EMBODIMENTS

FIG. 1 is a diagram illustrating a typical memory I/O buffer for one pair of bit lines according to the prior art. Buffer 100 includes a read column multiplexer element 102, a write column multiplexer element 104, a sense amplifier 106, and a separate set of write drivers 108.

Bit lines BL and BLN are coupled to a respective column of memory elements or cells (not shown) of the memory in which I/O buffer 100 is used. Read multiplexer element 102 has a select input RDSEL, a pair of complementary data inputs coupled to bit lines BL and BLN, a pair of complementary data outputs coupled to multiplexed read bit lines RBLX and RBLNX. Sense amplifier 106 has a non-inverting input coupled to read bit line RBLX and an inverting input coupled to read bit line RBLNX. The output of sense amplifier 106 is coupled to data output line OUT. A typical memory, data output OUT would be coupled to a respective data output latch (also not shown).

Write multiplexer element 104 has a select input WRSEL, a pair of a pair of complementary data outputs coupled to bit lines BL and BLN, and a pair of complementary data inputs coupled to multiplexed write bit lines WBLX and WBLNX. Write driver circuit 108 has a buffer amplifier 110 coupled between data input line IN and multiplexed write bit line WBLX, and a buffer amplifier 112 coupled between data input line INN and multiplexed write bit line WBLNX.

During a read access, the read column multiplexer element 102 of the selected column is enabled through its respective read select input RDSEL such that the voltages on bit lines BL and BLN are applied to the respective multiplexed read bit lines RBLX and RBLNX. The respective sense amplifier 106 is enabled to sense the data on RBLX and RBLNX and drive data output line OUT to the appropriate state. During a read access cycle, write driver 108 and write multiplexer element 104 are disabled.

During a write access, the write multiplexer element 104 of the selected column is enabled through its write select input WRSEL, and the respective write driver 108 amplifies the input data from IN and INN onto bit lines BL and BLN through write multiplexer element 104. Read column multiplexer element 102 and the sense amplifier 106 are optionally enabled during a write cycle to sense the data being written to the memory.

There is one sense amplifier 106 and one write driver 108 for each multiplexed data I/O line in the memory. Sense amplifier 106 and write driver 108 occupy separate physical areas in the I/O buffer 100. This increases the overall semiconductor area consumed by the I/O buffers, thereby increasing die cost and potentially limiting the number of memory elements that can be manufactured on a given integrated circuit. In addition, such memories often use separate column multiplexer circuitry and control logic for read and write operation, as shown in FIG. 1. This further increases die area.

FIG. 2 is a diagram illustrating a memory I/O buffer 200 in which the sense amplifier and write driver circuitry has been combined to share the same physical area on the integrated circuit. I/O buffer 200 includes column multiplexer element 202 and combined sense amplifier and write driver circuit 204. Circuit 204 performs both read sensing and write driving, and column multiplexer element 202 is selected during either a read access or a write access.

Column multiplexer element 202 is coupled between complementary bit lines BL and BLN and complementary multiplexed bit lines BLX and BLNX. Column multiplexer 202 has a select input SEL, which when active couples bit lines BL and BLN to multiplexed bit lines BLX and BLNX, respectively. Although only one column multiplexer element 202 is shown in FIG. 2, any number of column multiplexer elements can be used in alternative embodiments of the present invention to multiplex any number of bit lines into any number of multiplexed bit lines. The configuration of the column multiplexer depends on the number of columns of memory and the number of bits in the data input-output port of the memory. In addition, the bit lines can be complementary as shown in FIG. 2 or single-ended.

Combined sense amplifier and write driver circuit 204 is coupled between multiplexed bit lines BLX and BLNX and data input-output lines IOBLX and IOBLNX. Data output lines OUT and OUTN are typically coupled to a data output latch (not shown), and data input lines IN and INN are typically coupled to a data input latch (also not shown).

Circuit 204 further includes a sense enable input SENSE and a write enable input WRITE, which are selectively activated during read and write accesses. Thus, circuit 204 is enabled during either a read access state or a write access state and is disabled during an idle state. During a read access, the column select input SEL for the selected column is activated, which allows the voltages on bit lines BL and BLN to appear on multiplexed bit lines BLX and BLNX. Multiplexed bit lines BLX and BLNX are sensed by the sense amplifier in circuit 204.

In one embodiment, circuit 204 precharges IOBLX and IOBLNX to a predetermined voltage, such as a logic high voltage. After sufficient voltage separation has developed between BLX and BLNX, sense enable input SENSE is activated. The precharge on IOBLX and IOBLNX is removed and one of IOBLNX and IOBLNX will fall low and the other will remain high, depending upon the data on BLX and BLXN. The resulting states on IOBLX and IOBLNX can then be latched through data output lines OUT and OUTN.

During a write access, the column select input SEL for the selected column is activated, which allows bit lines BL and BLN to be driven by the write driver in circuit 204 for that column. Write enable input WRITE for the selected column is activated, which causes the data on data input lines IN and INN to be amplified onto multiplexed bit lines BLX and BLNX and therefore bit lines BL and BLN. The semiconductor devices in circuit 204 have a higher drive strength than the semiconductor devices used to form the memory elements that are coupled to bit lines BL and BLN. This allows circuit 204 to overwrite the data stored in the memory cells.

FIG. 3 is a diagram illustrating combined sense amplifier and write driver circuit 204 in greater detail according to one embodiment of the present invention. In this embodiment, circuit 204 is configured as a non-isolated latching amplifier.

Circuit 204 includes input-output nodes N1 and N2, a latch formed by cross-coupled inverters 300 and 302, and an enable circuit 304. Inverter 300 includes N-Channel transistor MN1 and P-Channel transistor MP1. Inverter 302 includes N-Channel transistor MN2 and P-Channel transistor MP2. Enable circuit 304 includes N-Channel transistors MN3 and MN4.

Input-output node N1 is coupled between multiplexed bit line BLX and input-output line IOBLX. Input-output node N2 is coupled between multiplexed bit line BLNX and input-output line IOBLNX. Inverter 300 has an input IN1 coupled to node N2 and an output OUT1 coupled to node N1. Inverter 302 has an input IN2 coupled to node N1 and an output OUT2 coupled to node N2. Inverters 300 and 302 are therefore coupled back-to-back between nodes N1 and N2.

Within inverter 300, transistor MN1 has a gate coupled to IN1, a drain coupled to OUT1 and a source coupled to the drains of enable transistors MN3 and MN4. Transistor MP1 has a gate coupled to IN1, a drain coupled to OUT1 and a source coupled to voltage supply terminal VDD. Within inverter 302, transistor MN1 has a gate coupled to IN2, a drain coupled to OUT2 and a source coupled to the drains of enable transistors MN3 and MN4. Transistor MP2 has a gate coupled to IN2, a drain coupled to OUT2 and a source coupled to voltage supply terminal VDD.

Enable transistor MN3 has a gate coupled to sense enable input SENSE, a drain coupled to the sources of MN1 and MN2 and a source coupled to voltage supply terminal VSS. Enable transistor MN4 has a gate coupled to write enable input WRITE, a drain coupled to the sources of MN1 and MN2 and a source coupled to voltage supply terminal VSS.

During operation when both enable inputs SENSE and WRITE are inactive at logic low states (for example), enable transistors MN3 and MN4 are off and de-couple inverters 300 and 302 from VSS. This results in transistors MP1 and MP2 pulling both nodes N1 and N2 high to a precharged, logic high state.

During a read access through the selected column, sense enable input SENSE is activated to a logic high state, turning on enable transistor MN3. Transistor MN3 pulls the sources of MN1 and MN2 low toward VSS, which enables the latch formed by cross-coupled inverters 300 and 302. Nodes N1 and N2 rapidly switch toward complementary logic states depending on the relative voltages on BLX and BLNX, due to the strong positive feedback of cross-coupled inverters 300 and 302. The resulting logic states on N1 and N2 and thus IOBLX and IOBLNX can then be latched by a data output latch.

During a write access, write enable input WRITE for the selected column is activated to a logic high state, which turns on enable transistor MN4. Transistor MN4 pulls the sources of MN1 and MN2 low to enable the latch formed by cross-coupled inverters 300 and 302. Depending on the relative logic states on IOBLX and IOBLNX, which are provided from a data input latch, the strong positive feedback of cross-coupled inverters 300 and 302 cause nodes N1 and N2 to rapidly switch toward the respective logic levels defined by VDD an VSS. Inverters 300 and 302 thereby drive the respective logic states onto BLX and BLNX.

As mentioned above, transistors MN1, MN2, MP1 and MP2 are fabricated to have higher drive strengths than the transistors that are used to form the memory cells in the memory array. Therefore, transistors MN1 and MN2, MP1 and MP2 are capable of driving the bit lines of the selected column with a sufficient strength to overwrite the data stored in the selected memory cells.

In an alternative embodiment, circuit 204 can be constructed with a single enable input, which is controlled by a logical-OR of the SENSE and WRITE signals, rather than two enable inputs. This single enable input can be supplied to multiple I/O buffers. Also, circuit 204 can be modified to support single-ended bit lines, rather than complementary bit lines. The circuit can be inverted, if desired. Also, different types of latches can be used in alternative embodiments of the present invention. Additional elements can be added to add additional functionality.

In the embodiment shown in FIG. 3, the sense amplifier and the write driver are combined to share the same physical area on the integrated circuit. The sense amplifier and write driver share the same circuitry, which in the embodiment shown in FIG. 3 includes cross-coupled inverters 300 and 302. The sharing of circuitry between the sense amplifier and the write driver therefore reduces the physical area consumed by the I/O buffer. This reduces overall integrated circuit area, thereby reducing die cost. Also, it may be possible to fabricate more memory elements on the integrated circuit since less area is consumed by the I/O buffers.

In addition, the sense amplifier formed by cross-coupled inverters 300 and 302 is not isolated from multiplexed bit lines BLX and BLNX. In a typical sense amplifier a pair of P-Channel pass-gate transistors are coupled in series with BLX and BLNX to selectively isolate the sense amplifier from the bit lines. The isolating transistors have been removed in the embodiment shown in FIG. 3. However these isolating transistors can be added if desired in alternative embodiments.

Although the present invention has been described with reference to preferred embodiments, workers skilled in the art will recognize that changes may be made in form and detail without departing from the spirit and scope of the invention. For example, the present invention can be implemented with a variety of semiconductor technologies, such as CMOS. Various circuit configurations can be used. The transistors shown in the figures can include individual transistors or arrays of transistors coupled together in parallel with one another. The voltage supply terminals can be relatively positive or relatively negative depending upon the particular convention adopted and the technology used and can include a power supply bus or a biased referenced terminal having a voltage other than that of the power supply bus, for example. The terms "high" and "low" used in the specifications and the claims are arbitrary terms and are interchangeable with a logical inversion of the circuit. Likewise, the term "coupled" can include various types of connections or couplings and can include a direct connection or a connection thorough one or more intermediate components.

What is claimed is:

1. A memory input-output (IO) buffer comprising:
a first bit line;
a first data input-output line; and
a combined sense amplifier and write driver coupled to the first data input-output line and the first bit line, wherein the memory IO buffer is fabricated on an integrated circuit and the combined sense amplifier and write driver share common semiconductor elements and the same physical area on the integrated circuit.

2. The memory IO buffer of claim 1 and further comprising:
a column multiplexer element coupled between the combined sense amplifier and write driver and the first bit line.

3. The memory IO buffer of claim 1 wherein the combined sense amplifier and write driver comprises a latching amplifier.

4. The memory IO buffer of claim 3 wherein the latching amplifier is non-isolated from the bit line such that the first data input-output line is coupled directly to the first bit line.

5. The memory IO buffer of claim 1 and further comprising:
a second bit line, wherein the first and second bit lines form a complementary bit line pair;
a second data input-output line wherein the first and second data input-output lines form a complementary data input-output line pair; and
wherein the combined sense amplifier and write driver is coupled between the complementary bit line pair and between the complementary data input-output line pair.

6. The memory IO buffer of claim 5 wherein the combined sense amplifier and write driver comprises:
first and second cross-coupled inverters coupled between the first and second bit lines and between the first and second data input-output lines.

7. The memory IO buffer of claim 6 and further comprising a read sense and write drive enable circuit, wherein the first and second cross-coupled inverters are biased between first and second voltage supply terminals, and the read sense and write drive enable circuit is coupled in a bias path between the cross-coupled inverters and the second voltage supply terminal.

8. The memory IO buffer of claim 7 wherein the read sense and write drive enable circuit comprises:
a sense enable input;
a write enable input;
a sense enable transistor coupled in series between the first and second cross-coupled inverters and the second voltage supply terminal and having a control terminal coupled to the sense enable input; and
a write enable transistor coupled in series between the first and second cross-coupled inverters and the second voltage supply terminal and having a control terminal coupled to the write enable input.

9. A combined sense amplifier and write driver circuit comprising:
first and second complementary bit lines;
first and second complementary data input-output lines; and
a selectively enabled latching amplifier coupled to the first and second complementary bit lines and the first and second complementary data input-output lines, wherein the latching amplifier is enabled during a read state and a write state and is disabled during an idle state.

10. The circuit of claim 9 wherein the latching amplifier is non-isolated from the first and second complementary bit lines such that the first data input-output line is coupled directly to the first bit line and the second data input-output line is coupled directly to the second bit line.

11. The circuit of claim 9 wherein the latching amplifier comprises:
first and second cross-coupled inverters coupled between the first and second complementary bit lines and between the first and second complementary data input-output lines.

12. The circuit of claim 11 and further comprising a read sense and write drive enable circuit, wherein the first and second cross-coupled inverters are biased between first and second voltage supply terminals, and the read sense and write drive enable circuit is coupled in a bias path between the cross-coupled inverters and the second voltage supply terminal.

13. The circuit of claim 12 wherein the read sense and write drive enable circuit comprises:

a sense enable input;

a write enable input;

a sense enable transistor coupled in series between the first and second cross-coupled inverters and the second voltage supply terminal and having a control terminal coupled to the sense enable input; and a write enable transistor coupled in series between the first and second cross-coupled inverters and the second voltage supply terminal and having a control terminal coupled to the write enable input.

14. A memory input-output (IO) buffer comprising:

first and second complementary bit lines;

first and second complementary data input-output lines;

a column multiplexer element coupled to the complementary bit lines; and combined read sense and write driver means, coupled between the column multiplexer element and the complementary data input-output lines, for sensing voltages on the complementary bit lines through the column multiplexer element during a read state and for driving voltages on the complementary bit lines through the column multiplexer element during a write state.

* * * * *